(12) United States Patent
Choi

(10) Patent No.: US 8,460,995 B2
(45) Date of Patent: Jun. 11, 2013

(54) METHOD OF FORMING A MIM CAPACITOR

(75) Inventor: Jeong Y. Choi, Palo Alto, CA (US)

(73) Assignee: MoSys, Inc., Santa Clara, CA (US)

( * ) Notice: Subject to any disclaimer, the term of this patent is extended or adjusted under 35 U.S.C. 154(b) by 61 days.

(21) Appl. No.: 12/804,855

(22) Filed: Jul. 30, 2010

(65) Prior Publication Data
US 2012/0025347 A1 Feb. 2, 2012

(51) Int. Cl.
*H01L 21/8242* (2006.01)

(52) U.S. Cl.
USPC .......................................... 438/239

(58) Field of Classification Search
USPC ................... 438/241, 386, 253, 23, 239, 238, 438/243, 387
See application file for complete search history.

(56) References Cited

U.S. PATENT DOCUMENTS 6,720,232 B1 * 4/2004 Tu et al. ...................... 438/396

* cited by examiner

*Primary Examiner* — Nikolay Yushin
(74) *Attorney, Agent, or Firm* — MoSys, Inc.

(57) ABSTRACT

An embedded memory system includes an array of random access memory (RAM) cells, on the same substrate as an array of logic transistors. Each RAM cell includes an access transistor and a capacitor structure. The capacitor structure is fabricated by forming a metal-insulator-metal capacitor in a dielectric layer. The embedded RAM system includes fewer metal layers in the memory region than in the logic region.

9 Claims, 5 Drawing Sheets

METHOD OF FORMING A MIM CAPACITOR

BACKGROUND OF THE INVENTION

It is known to combine different functional blocks on a single IC chip for density and cost advantages. However, improvements in circuit density may cause the parasitic resistance and capacitance of the device to increase. Memory and logic components are generally formed using different process technologies to enhance the performance of each individual component. Therefore, to effectively integrate distinct functional blocks, the overall manufacturing process must be modified without introducing significant complexity.

Several processes for incorporating a metal-insulator-metal (MIM) capacitor into an embedded DRAM (eDRAM) system are known. Typically, a MIM capacitor is inserted between the silicon substrate and the first metal layer. This configuration is usually preferred because it offers smaller memory cells than designs having a MIM capacitor over the first metal layer. However, this type of fabrication results in an elongated contact between the first metal layer and substrate. As a result, taller contacts or vias increase the resistance (R) for a specific contact as well as the parasitic capacitance (C) between contact pairs. With the continued scaling of integrated circuits, routing wires are more closely packed leading to an increase in the parasitic capacitance (C) between the interconnect metal and adjacent metal layers. Scaling also reduces the dimensions of the routing wires leading to an increase in the interconnect resistance (R). Consequently, scaling and current fabrication processes increase the interconnect RC, which contributes to slower logic speeds. Therefore, current eDRAM processes are unsuitable for fabricating a high-performance SoC (system on a chip). Similarly, increased via resistance and capacitance reduce speeds in eDRAM systems having MIM capacitors between two metal layers. Therefore, a need exists for an improved process for manufacturing eDRAM systems that contain a MIM capacitor.

FIELD OF THE INVENTION

The present invention relates to a semiconductor structure that contains a DRAM embedded in a logic device, and the method for forming such a structure.

The present invention further relates to a DRAM system that is fabricated by slightly modifying a conventional logic process. The DRAM system of the invention provides for interconnects having reduced parasitic resistance and capacitance.

SUMMARY OF INVENTION

An improved method for fabricating an embedded DRAM system with a MIM capacitor is achieved. The DRAM system of the invention has an embedded memory and a logic circuit on the same substrate.

In a particular embodiment, the invention concerns a semiconductor structure having reduced parasitic resistivity. The structure includes a semiconductor substrate that is divided into a memory region and a logic region, wherein the first metal layer is present only in the logic region.

A first dielectric layer, containing a MIM capacitor, is disposed over the DRAM region. The first dielectric layer is also present in the logic region. This first dielectric layer functions as an interlevel dielectric layer in the logic region to enable the two metal layers to electrically connect through a via filled with a conductive material. The same metal layer present in both the DRAM region (as a first metal layer M1), and the logic region (as a second metal layer M2) is coupled to the underlying substrate. A coupling via present in only the memory region electrically couples the MIM capacitor to the metal layer immediately adjacent to the coupling via.

The invention is also directed to a method for forming an embedded DRAM system that includes DRAM cells and logic transistors on a single substrate, where the contacts are formed from different conductive material. The use of two different types of plugs reduces the overall interconnect resistance, and improves system level performance by enhancing the speed and power features of the invention.

DETAILED DESCRIPTION

The present invention provides several methods for fabricating an embedded DRAM having an improved interconnect resistance. As devices scale downward in geometry, the interconnect resistance of the device increases. This invention reduces the interconnect resistance through the processes of FIGS. 1A-1C and FIGS. 3A-3D.

Figure 1A:
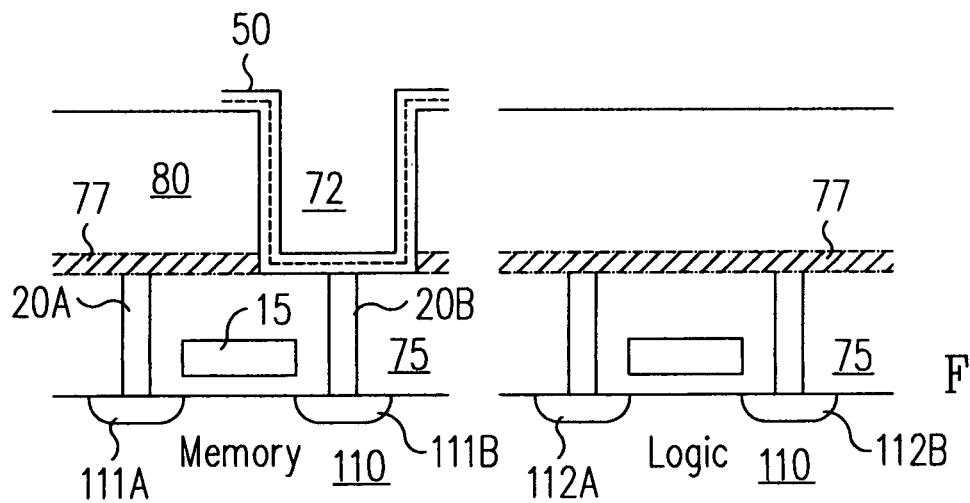
FIGS. 1A-1C illustrate cross sectional views of a process flow for forming an embedded DRAM system having a MIM capacitor in accordance with a first embodiment of the invention.
Figure 1B:
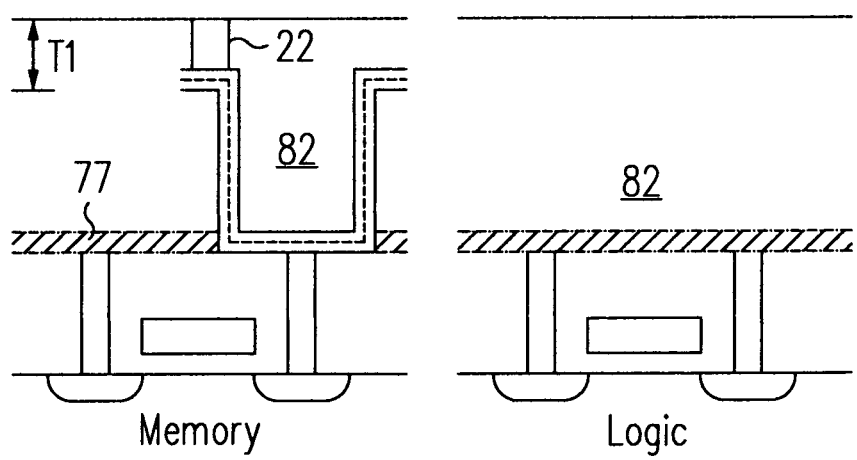
Figure 1C:
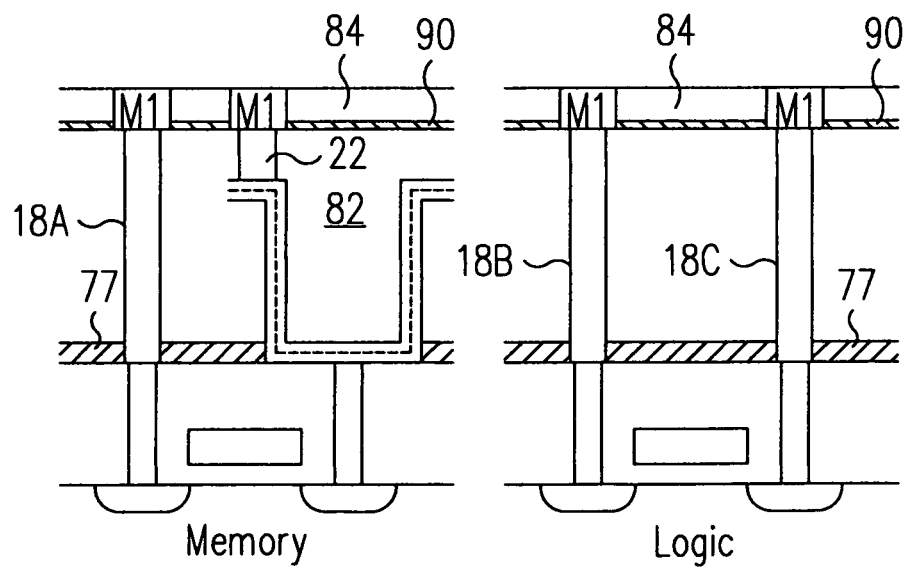

The invention will be more readily understood in reference to FIGS. 1A-1C. A portion of a semiconductor structure is shown in FIG. 1A. Specifically, FIG. 1A illustrates a doped substrate 110 upon which an insulating layer 75 is formed. A gate 15 is formed on the substrate in accordance with well known techniques. Substrate 110 is provided with source/drain regions 111A and 111B in the memory area, and with source/drain regions 112A and 112B in the logic area. The structure of FIG. 1A also includes a set of contacts 20A/20B and a first dielectric layer 80. Dielectric layer 80 preferably has a thickness of between about 5000 and 100,000 angstroms. Portions of dielectric layer 80 and layer 77 are etched to form an opening having a lower surface contiguous with dielectric layer 75 and contact 20B. Within the opening, a lower capacitor plate is deposited that is contiguous with contact 20B. Upon this capacitor plate is provided an insulating layer, and then an upper capacitor plate is deposited on the insulating layer. Suitable materials for the capacitor plates may be TiN, Ta, or TaN. The resulting stack is then masked and etched in a conventional manner to form MIM capacitor 50.

The interior of capacitor 50 is shown as cavity 72 in FIG. 1A. A dielectric layer 82 is disposed to fill cavity 72 of capacitor 50, thereby increasing the thickness of layer 80 by an amount T1. The thicker dielectric layer is shown as layer 82 in FIG. 1B. T1 may have a thickness ranging from 2000-7000 angstroms. In other embodiments, T1 may be formed by disposing a much thicker layer, thicker than layer 80, and then polishing the structure to the desired thickness level. After dielectric layer 82 is formed, a mask (not shown) is disposed over the partially completed structure and dielectric layer 82 is selectively etched to form via 22. Via 22 is preferably filled with conductive material such as tungsten to form the structure of FIG. 1B. By separately forming conductive plug 22, the present invention reduces the interconnect resistance of the eDRAM memory systems.

A dual damascene process may be used to form vias 18A, 18B and 18C, and metallization region M1 after plug 22. This is achieved by providing etch stop layer 90 and dielectric layer 84 over the entire structure as shown in FIG. 1C. Then, grooves for M1 are formed in layer 84 down to the depth of layer 90. In addition, via holes 18A, 18B and 18C are formed in layer 82 down to the depth of layer 77.

Figure 2A:
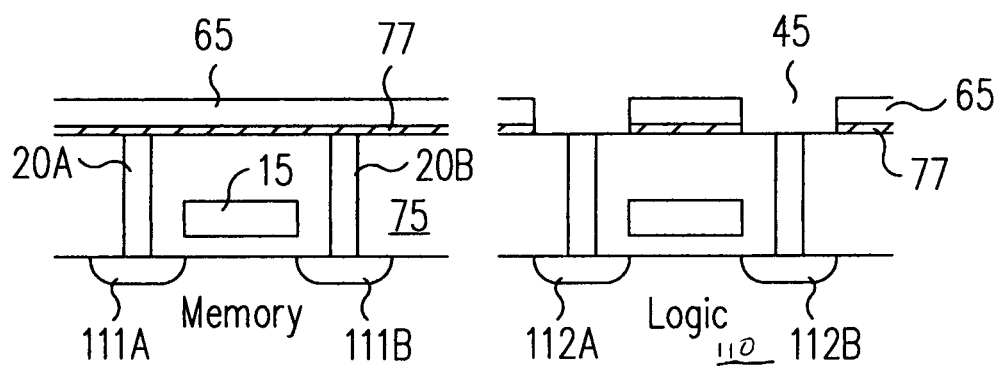
FIGS. 2A-2D illustrate cross sectional views of a process flow for forming an embedded DRAM system having a MIM capacitor in accordance with a second embodiment of the invention.
Figure 2B:
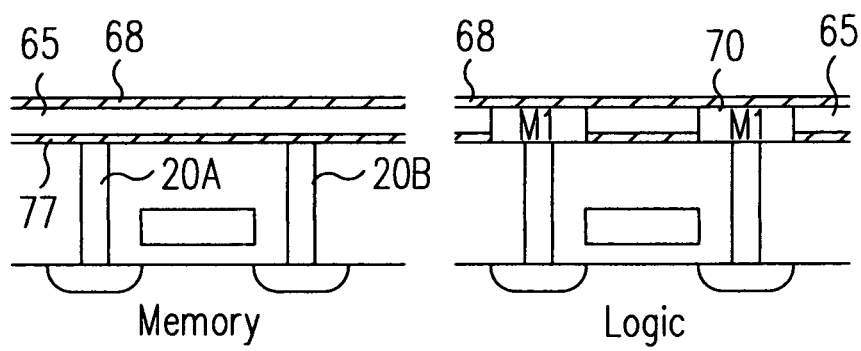

An alternative embodiment of the present invention is shown in FIGS. 2A-2D, in which an eDRAM system with copper-filled vias is formed. Similar elements in FIG. 2A-2D and FIGS. 1A-1C are labeled with similar reference numbers. A partially completed semiconductor structure is shown in FIG. 2A, where a set of contacts 20A, 20B are provided in insulating layer 75, and the substrate 110 has source/drain regions 111A, 111B, 112A and 112B. Grooves 45 for M1 regions are shown in only the logic area of the structure, because M1 regions are absent from the memory area. The M1 regions are usually fabricated to have a thickness of between 2000 to 7000 angstroms. Etch stop layer 77 is also shown in FIG. 2A covering insulating layer 75 and contacts 20A/20B. Turning to FIG. 2B, a dielectric layer 65 is disposed above etch stop layer 77, and later etched to form grooves 45. Next, metal layer M1 is deposited in the grooves to complete metal lines in the logic area. Then, a second etch stop layer 68 is provided above dielectric layer 65 and metal lines 70 as shown in FIG. 2B.

Figure 2C:
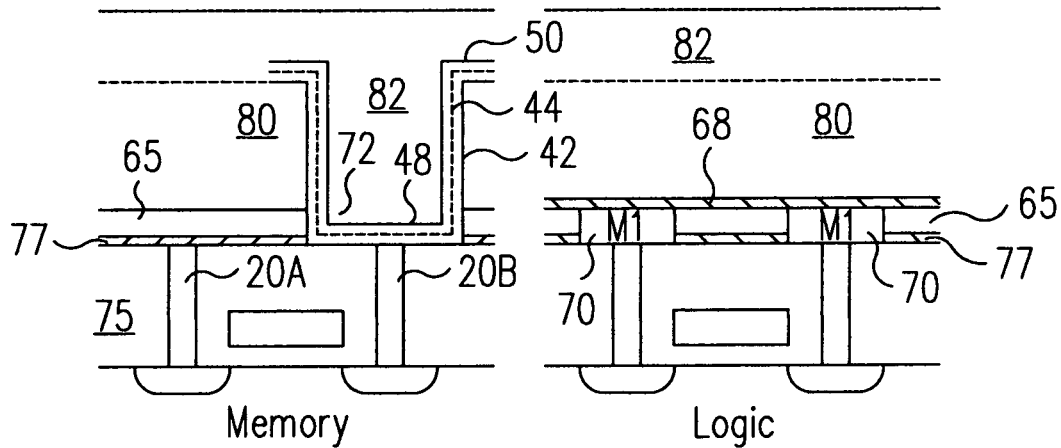
Figure 2D:
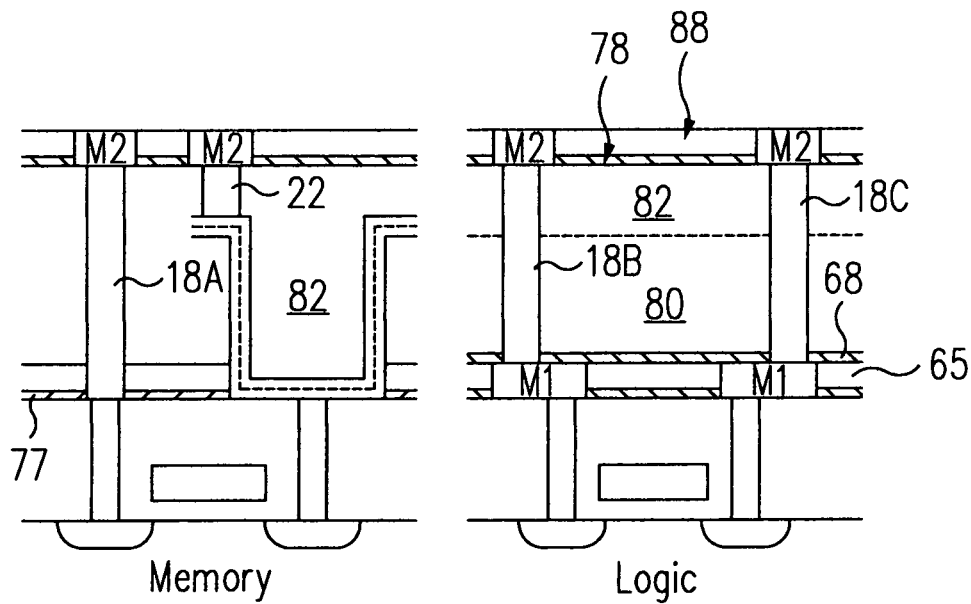

The process continues in FIG. 2C, where a mask (not shown) is provided over the logic area to remove both etch stop layer 68 (and optionally dielectric layer 65) from the memory area. Removal of layer 68 from only the DRAM area allows direct connection between contact 20A and the later formed via 18A. Subsequently, a first dielectric layer 80 is disposed on layer 65 (or 77) in the memory area and layer 68 in the logic area. A portion of layers 80 (layer 65 is also removed if it was not removed in the prior etch step) and 77 are then removed, followed by the deposit of a first capacitor plate 42. Upon capacitor plate 42, an insulating layer 44 is disposed. Then capacitor plate 48 is provided on layer 44. The resulting stack of layers 42, 44 and 48 is masked and etched to complete the formation of MIM capacitor 50. Next, a second dielectric layer 82 is provided above dielectric layer 80 to fill the cavity 72 of capacitor 50, and to increase the thickness of dielectric layer 80. In FIG. 2D an etch stop layer 78 is provided over dielectric layer 82, which in turn is covered by a third dielectric layer 88. Then, layer 88 is patterned to create grooves (not shown) for metallization region M2. A mask (not shown) is placed on dielectric layer 88 and patterned to simultaneously form vias 18A, 18B, 18C and 22.

FIG. 2D illustrates the result of performing a conventional dual damascene process to fill grooves 45 and vias 18A, 18B and 18C with copper. Preferably, the M2 region is formed to have an equivalent thickness as the M1 region in order to maintain the small size of the conventional MIM cell. However, due to the absence of the metal 1 layer (M1) in the memory area, via 18A in the memory area must be etched to a depth of 2000-7000 angstroms greater than the depth of vias 18B and 18C in the logic area. Layers 77 and 68 serve as etch-stop layers for the via etch in the DRAM and logic regions, respectively. The present invention reduces the contact height in the logic area by including a metal 1 layer in only the logic portion of the system. As a result, the RC in the logic area is also reduced. This process leads to the contact resistance and capacitance of the eDRAM system being maintained at the values expected for a pure logic process. In other words, the vertical contact in the logic area does not require a process change in the present invention. Moreover, the absence of M1 regions in the memory area produces a smaller cell size and an eDRAM system having an RC in the logic area equivalent to the RC of a logic device without memory.

An alternative embodiment for reducing the interconnect RC of the invention is shown in FIGS. 3A-3D, in which an eDRAM system having two different types of conductive plugs is shown. This embodiment is directed to an eDRAM system in which the copper via is not allowed to directly touch the MIM electrode.

Figure 3A:
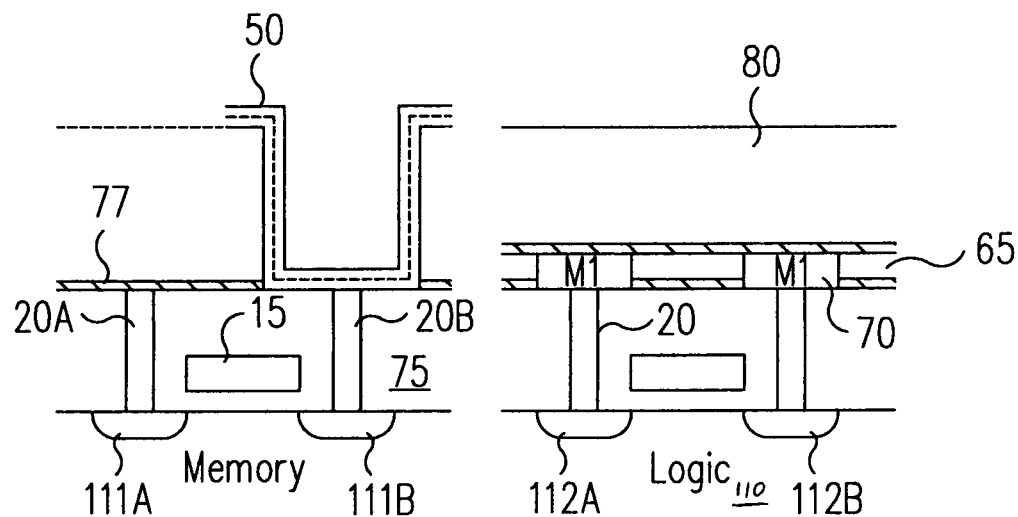
FIGS. 3A-3D illustrate cross sectional views of a process flow for forming an embedded DRAM system having a MIM capacitor and two different plugs in accordance with a third embodiment of the invention.
Figure 3B:
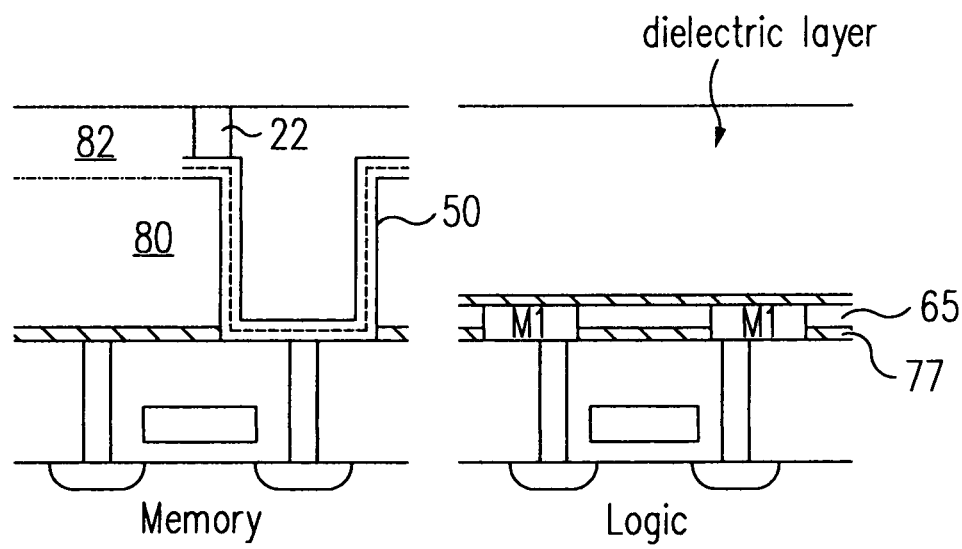
Figure 3C:
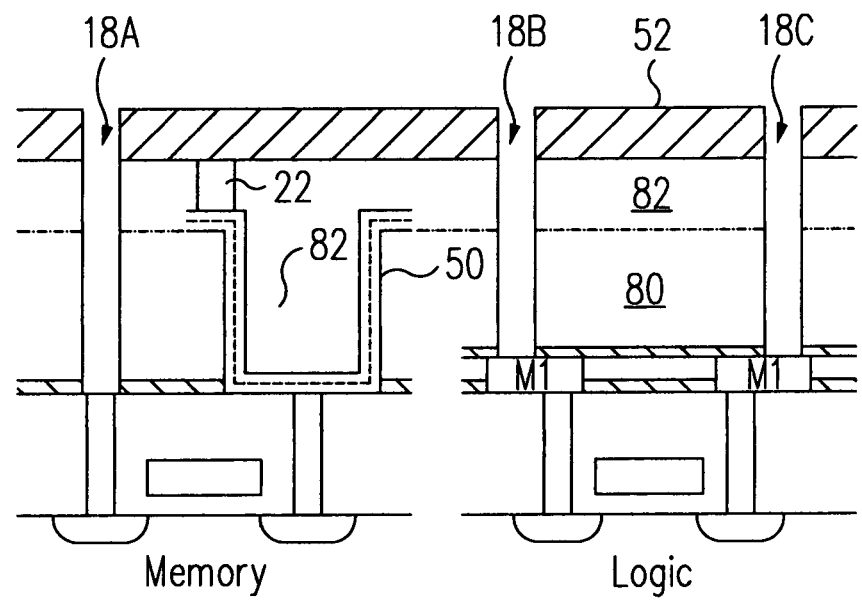

The MIM capacitor of FIG. 3A is fabricated according to the process described for FIGS. 2A-2C. Then a dielectric layer 82 is deposited above dielectric layer 80 to fill the cavity of capacitor 50, and to increase the thickness of dielectric layer 80. A mask (not shown) is disposed over dielectric layer 82 to selectively etch via 22. Via 22 is preferably filled with tungsten. As shown in FIG. 3B, via 22 is connected to capacitor 50. Then mask 52 is placed over via 22 and dielectric layer 82 as shown in FIG. 3C to define the areas where vias 18A, 18B and 18C will be created. Vias 18A, 18B and 18C are electrically coupled to contacts 20 that are contained within insulating layer 75. Mask 52 is removed after vias 18A, 18B and 18C are formed. Then, the vias are filled with a conductive material having a lower resistance than tungsten. In a dual damascene process, the vias may be etched after forming M2 grooves in layer 88.

Figure 3D:
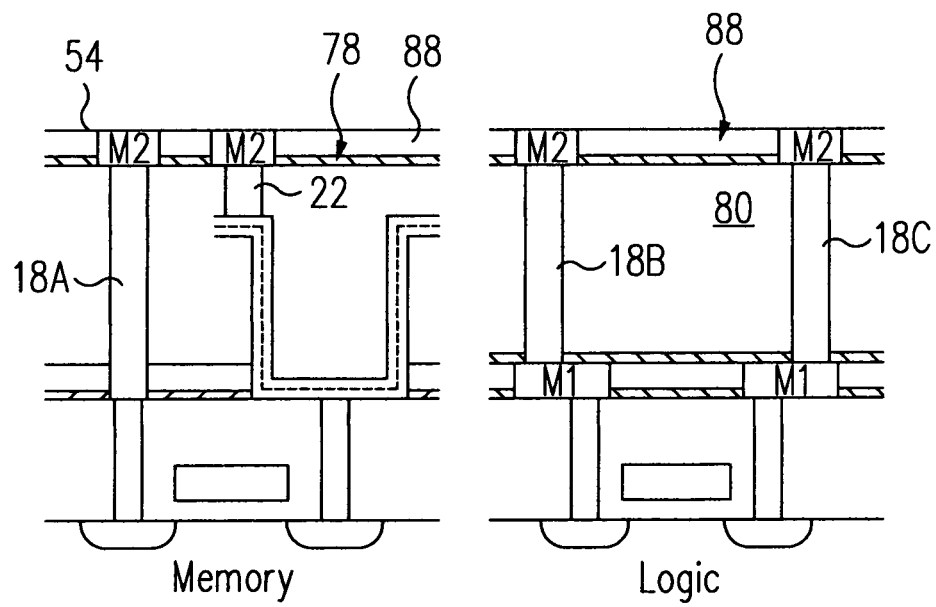

To provide for a controlled etch in the future process steps, an etch stop layer 78 is provided on vias 18A, 188 and 18C and 22. Dielectric layer 88 is then provided over layer 78, and, subsequently patterned to form grooves for the second metallization regions (M2). Then, grooves 54 are filled with a conductive material having a lower resistance value than tungsten. Preferably, vias 18 and grooves 54 are filled with copper or a copper alloy. A passivation layer is provided over the upper surface of dielectric layer 88 and M2 regions to complete the structure that is shown in FIG. 3D. The resulting structure has both a reduced interconnect resistance and a reduced capacitance compared to other embedded DRAM systems. Additional metal layers may be provided, if desired, between M2 and passivation layer to form a more complex interconnect.

The present invention has been described by the examples above. However, these embodiments are illustrative only and are not intended to limit the invention in any way. For example, the logic structures shown need not be repeated in every logic area. Some logic structures within an IC device can have fewer or more vias than shown depending on whether a higher level metal is necessary for the interconnect. Although the present invention has been described as an eDRAM having a MIM capacitor inserted between the substrate and the first metal layer, the process of the present invention is also applicable to inserting the MIM capacitor between two metal layers in a memory region. The implementation of the described process could be easily adapted by the skilled artisan for incorporating the MIM capacitor, coupling vias and metal layers into a system where a capacitor is desired between two metal layers instead of between a metal layer and a substrate. The skilled artisan would readily appreciate that the aforementioned embodiments are capable of various modifications. Thus, the invention is defined by the claims set forth below.

What is claimed is:

1. A method of forming an embedded DRAM system including DRAM cells and logic transistors on a single substrate, each of the DRAM cells having a metal insulator-metal (MIM) capacitor, the method comprising:
   providing a first dielectric layer above the substrate;
   selectively etching an opening in the first dielectric layer to form a MIM capacitor within a memory region;
   increasing the thickness of the first dielectric layer, and then planarizing the first dielectric layer;
   forming a hole through said planarized layer to form a coupling via that is coupled to the MIM capacitor;
   forming a second dielectric layer above said coupling via;
   simultaneously forming via openings in the memory and logic regions after the coupling via is formed;
   filling said via openings with a conductive material to form interconnect portions having a lower resistivity than said coupling via.

2. The method of claim 1, wherein a dual damascene process is used to fill the via openings that are simultaneously formed after formation of the coupling via in the embedded DRAM system.

3. A method of forming an embedded DRAM system including DRAM cells and logic transistors on a single substrate, each of the DRAM cells having a metal-insulator-metal {MIM} capacitor, the method comprising:
   forming an insulating layer above the substrate;
   forming a first metal layer in one region of the DRAM system;
   providing a first dielectric layer above the DRAM system;
   forming a MIM capacitor in the first dielectric layer after the first metal layer has been formed;
   providing a second dielectric layer above the first dielectric layer;
   forming a coupling via in the second dielectric layer above the MIM capacitor;
   simultaneously forming a second via in the memory region and a third via in a logic region;
   providing a third dielectric layer;
   filling the coupling via with a conductive material having a different resistivity than the conductive material provided in the second and third vias.

4. The method of claim 3, wherein a dual damascene process is used to fill the vias that are simultaneously formed after the coupling via.

5. A method of forming an embedded DRAM system including DRAM cells and logic transistors on a single substrate, each of the DRAM cells having a metal-insulator-metal (MIM) capacitor, the method comprising:
   forming an insulating layer above the substrate;
   forming a first metal layer in one region of the DRAM system above the insulating layer;
   providing a first dielectric layer above the first metal layer;
   forming a MIM capacitor in a memory region after the first metal layer has been formed;
   providing a second dielectric layer above the first dielectric layer;
   forming a coupling via in the second dielectric layer that is coupled to the MIM capacitor;
   simultaneously forming a first set of vias in the first and second dielectric layer;
   forming interconnects in the DRAM system by filling the first set vias with a conductive material having a lower resistivity than the conductive material within the coupling via.

6. The method of claim 5, wherein the first metal layer is formed in only the logic region.

7. The method of claim 5, further comprising forming a second metal layer that electrically couples to the interconnects in the memory region and logic region.

8. The method of claim 5, wherein a dual damascene process is used to fill the first set of vias.

9. The method of claim 5, wherein the MIM capacitor has a top electrode that is not formed from the second metal layer.

* * * * *